(12) United States Patent
Horng et al.

(10) Patent No.: US 10,944,024 B1
(45) Date of Patent: Mar. 9, 2021

(54) METHOD FOR MANUFACTURING MICRO LIGHT-EMITTING DIODE CHIPS

(71) Applicant: National Chiao Tung University, Hsinchu (TW)

(72) Inventors: Ray-Hua Horng, Taichung (TW); Hsiang-An Feng, Hsinchu (TW); Cheng-Yu Chung, Taoyuan (TW); Chia-Wei Tu, Toufen (TW); Fu-Gow Tarntair, Taipei (TW)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 0 days.

(21) Appl. No.: 16/826,337

(22) Filed: Mar. 23, 2020

(30) Foreign Application Priority Data

Sep. 19, 2019 (TW) .................. 108133864

(51) Int. Cl.
| | |
|---|---|
| *H01L 33/00* | (2010.01) |
| *H01L 21/683* | (2006.01) |
| *H01L 33/40* | (2010.01) |
| *H01L 33/38* | (2010.01) |
| *H01L 33/32* | (2010.01) |

(52) U.S. Cl.
CPC ...... *H01L 33/0095* (2013.01); *H01L 21/6836* (2013.01); *H01L 33/0062* (2013.01); *H01L 33/0075* (2013.01); *H01L 33/0093* (2020.05); *H01L 33/32* (2013.01); *H01L 33/38* (2013.01);
(Continued)

(58) Field of Classification Search
CPC ..... H01L 33/38; H01L 27/0802; H01L 33/32; H01L 33/0025; H01L 33/007; H01L 33/0095; H01L 33/62; H01L 33/12; H01L 33/36; H01L 33/44; H01L 28/20; H01L 33/0093; H01L 33/40; H01L 33/06;
(Continued)

(56) References Cited

U.S. PATENT DOCUMENTS 6,790,695 B2 *  9/2004  Ogihara ............... B41J 2/45
                                              438/33
8,318,519 B2 * 11/2012  Doan .................. H01L 33/0093
                                              438/33
(Continued)

FOREIGN PATENT DOCUMENTS

TW         357429 B     5/1999
TW         463394 B    11/2001
(Continued)

OTHER PUBLICATIONS

Search Report appended to an Office Action, which was issued to Taiwanese counterpart application No. 108133864 by the TIPO dated Apr. 16, 2020, with an English translation thereof.

*Primary Examiner* — Savitri Mulpuri
(74) *Attorney, Agent, or Firm* — Hammer & Associates, P.C.

(57) ABSTRACT

A method for manufacturing micro light-emitting diode chips includes the steps of: providing a to-be-divided light-emitting component, which includes a metal substrate and a plurality of micro light-emitting diode dies disposed on the metal substrate to permit the metal substrate to define a to-be-etched region among the micro light-emitting diode dies; and etching the metal substrate to remove the to-be-etched region so as to divide the light-emitting component into a plurality of the micro light-emitting diode chips.

23 Claims, 4 Drawing Sheets

(52) U.S. Cl.
CPC .... *H01L 33/40* (2013.01); *H01L 2221/68327* (2013.01); *H01L 2933/0016* (2013.01)

(58) Field of Classification Search
CPC ..... H01C 7/006; H01C 7/008; Y10S 438/977; Y10S 438/958
See application file for complete search history.

(56) References Cited

U.S. PATENT DOCUMENTS

| | | | |
|---|---|---|---|
| 8,338,204 B2* | 12/2012 | Kim | H01L 33/0093 438/33 |
| 2016/0380151 A1 | 12/2016 | Lee et al. | |

FOREIGN PATENT DOCUMENTS

| | | |
|---|---|---|
| TW | I325021 B | 5/2010 |
| TW | I398022 B | 6/2013 |
| TW | I663882 B | 6/2019 |
| TW | I666301 B | 7/2019 |
| TW | I668279 B | 8/2019 |

* cited by examiner

METHOD FOR MANUFACTURING MICRO LIGHT-EMITTING DIODE CHIPS

CROSS-REFERENCE TO RELATED APPLICATION

This application claims priority of Taiwanese Patent Application No. 108133864, filed on Sep. 19, 2019.

FIELD

The disclosure relates to a method for manufacturing light-emitting diode chips, and more particularly to a method for manufacturing micro light-emitting diode chips.

BACKGROUND

Conventional light-emitting diodes (LEDs) typically have a size in the order of hundreds of micron. In contrast, micro light-emitting diodes (micro LEDs) have a size which is reduced to less than 100 micron. In addition, micro LEDs have good photoelectric properties such as self-luminosity, low power consumption, high brightness, and long service life. In recent years, micro-LEDS have become the focus of development of industry players as the application field of LEDs becomes more extensive.

In conventional processes for making LEDs, a light-emitting epitaxial film is grown on an epitaxial substrate and then transferred from the epitaxial substrate onto a light-reflective and thermal-dissipative substrate (for example, a metal substrate or a silicon substrate), so as to avoid the light emitted from the thus made LEDs to be absorbed by the epitaxial substrate and to improve dissipation of the heat produced by the thus made LEDs. The light-emitting epitaxial film is processed into a plurality of LED dies on the reflective and thermal-dissipative substrate. The reflective and thermal-dissipative substrate is subjected to mechanical cutting or laser cutting to obtain a plurality of LED chips, which can be further transferred to an application substrate.

However, when mechanical cutting is used to divide the reflective and thermal-dissipative substrate for making the micro-LEDs, the process difficulty increases and the cutting yield is inferior due to miniaturized spacing distances among the micro-LED dies on the substrate. Alternatively, when the laser cutting is used to divide the reflective and thermal-dissipative substrate for making the micro-LEDs, the thus divided substrate portions are liable to stick together due to the miniaturized spacing distances among the micro-LED dies on the substrate, which reduces the cutting yield.

SUMMARY

Therefore, an object of the disclosure is to provide a method for manufacturing micro light-emitting diode chips to overcome the shortcomings described above.

According to the disclosure, there is provided a method for manufacturing micro light-emitting diode chips, which includes the steps of:
a) providing a to-be-divided light-emitting component including
a metal substrate having a first surface and a second surface opposite to each other, and
a plurality of micro light-emitting diode dies disposed on the first surface of the metal substrate to permit the metal substrate to define a to-be-etched region among the micro light-emitting diode dies, two adjacent ones of the micro light-emitting diode dies being spaced apart from each other by a gap; and
b) etching the metal substrate to remove the to-be-etched region so as to divide the light-emitting component into a plurality of the micro light-emitting diode chips.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
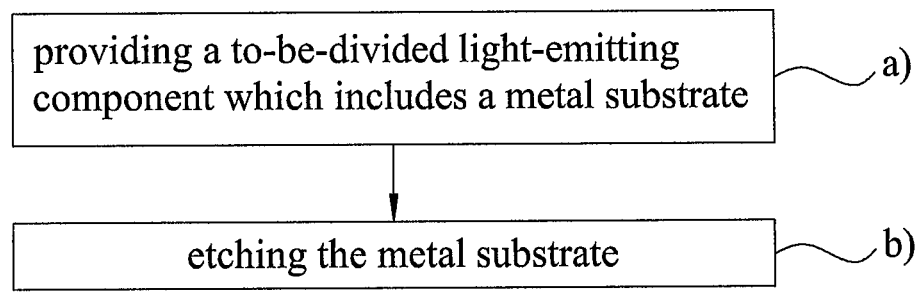
FIG. 1 is a flow diagram of a method for manufacturing micro light-emitting diode chips according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
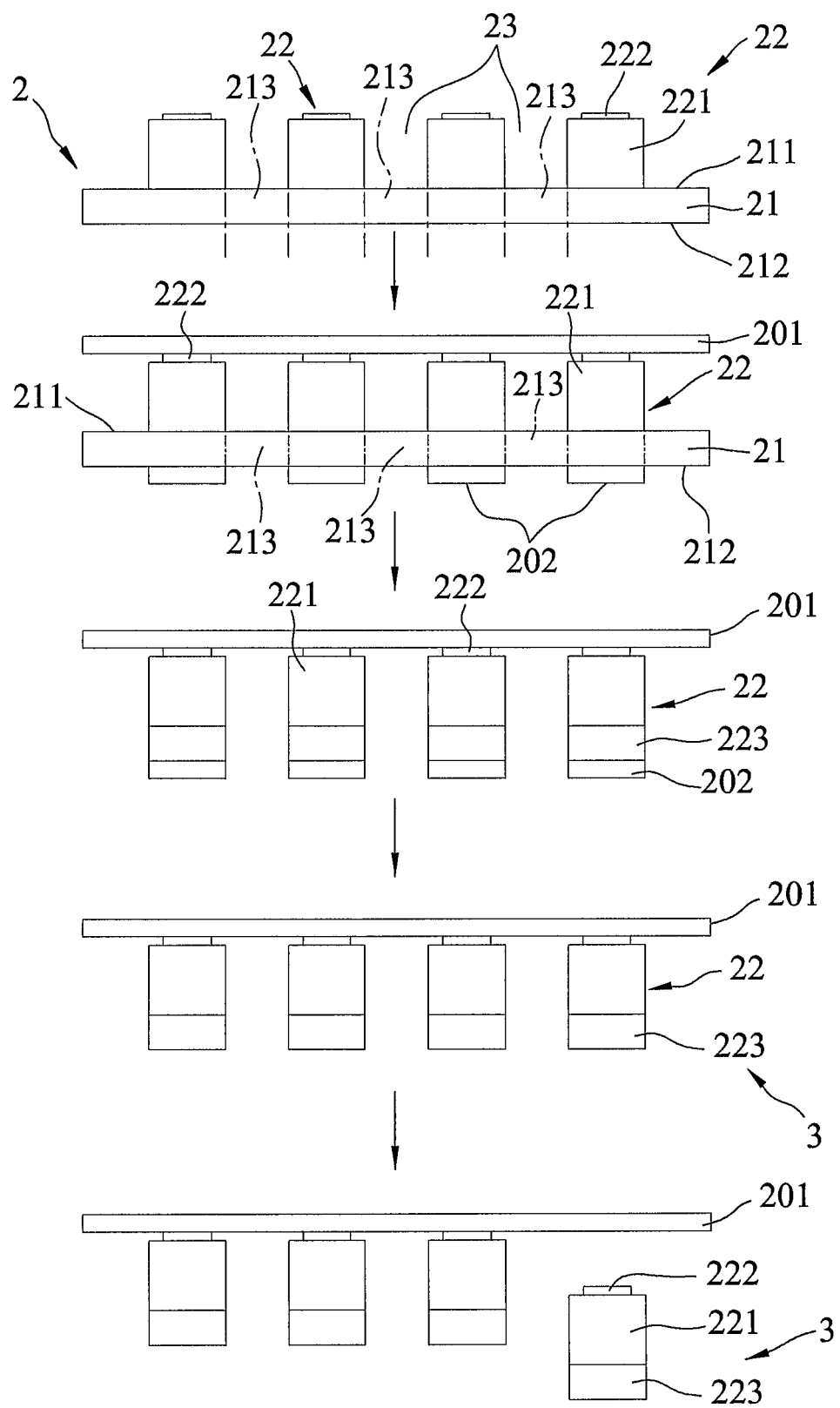
FIG. 2 shows schematic views illustrating consecutive steps of a first embodiment of the method according to the disclosure.

Referring to FIGS. 1 and 2, a first embodiment of a method for manufacturing micro light-emitting diode chips 3 according to the disclosure includes the steps of a) providing a to-be-divided light-emitting component 2 which includes a metal substrate 21; and b) etching the metal substrate 21.

Specifically, in step a), the to-be-divided light-emitting component 2 includes the metal substrate 21 and a plurality of micro light-emitting diode dies 22. The metal substrate 21 has a first surface 211 and a second surface 212 opposite to each other. The micro light-emitting diode dies 22 are disposed on the first surface 211 of the metal substrate 21 to permit the metal substrate 21 to define a to-be-etched region 213 among the micro light-emitting diode dies 22. Two adjacent ones of the micro light-emitting diode dies 22 are spaced apart from each other by a gap 23.

The metal substrate 21 is used as a permanent substrate for supporting the micro light-emitting diode dies 22 transferred from an epitaxial substrate. The metal substrate 21 can be a single-layered metal substrate or a multi-layered composite metal substrate. A non-liming example of the single-layered metal substrate is a copper substrate. A non-limiting example of the multi-layered composite metal substrate is a magnetic composite metal substrate which includes a first copper layer, a second copper layer, and a nickel-iron alloy layer sandwiched between the first and second copper layers (e.g., a copper/Invar/copper (CIC) composite metal substrate). Invar is a nickel-iron alloy consisting of about 36% of nickel and about 64% of iron. In certain embodiments, the metal substrate 21 has a thickness of less than 100 μm. In certain embodiments, the metal substrate 21 has a thickness of less than 50 μm.

Each of the micro light-emitting diode dies 22 has a size of less than 100 μm, and includes a light-emitting epitaxial layer 221 disposed on the first surface 211 of the metal substrate 21 and a first electrode 222 disposed on the light-emitting epitaxial layer 221 opposite to the metal substrate 21. The micro light-emitting diode dies 22 are bonded to the metal substrate 21 via wafer bonding.

The light-emitting epitaxial layer 221 is made of a semiconductive material, and emits light of a predetermined color (for example, red, blue, or green) via a photoelectric effect while receiving an electric energy. Examples of the semiconductive material includes GaN (gallium nitride) series materials and AlGaInP (aluminum gallium indium phosphide) series materials, but are not limited thereto.

The first electrode 222 is made from a metal or a metal alloy having good conductivity, and is electrically connected to the light-emitting epitaxial layer 221 and supplies the electric energy to the light-emitting epitaxial layer 221.

In certain embodiments, step a) is implemented by a process including sub-steps of: a1) preparing a semi-product of the to-be-divided light-emitting component 2, and a2) performing a patternwise etching treatment.

In sub-step a1), the semi-product is prepared by growing on an epitaxial substrate, a single-layered or a multi-layered continuous light-emitting epitaxial film which can emit light of at least one predetermined color, transferring the continuous light-emitting epitaxial film from the epitaxial substrate to the metal substrate 21 via wafer bonding, removing the epitaxial substrate from the continuous light-emitting epitaxial film, and forming a plurality of the first electrodes 222 on the continuous light-emitting epitaxial film opposite to the metal substrate 21 via metal deposition. The first electrodes 222 are spaced apart from one another. The semi-product thus prepared includes the metal substrate 21, the continuous light-emitting epitaxial film disposed on the first surface 211 of the metal substrate 21, and a plurality of the first electrodes 222 disposed on the continuous light-emitting epitaxial film opposite to the metal substrate 21 and spaced apart from one another.

In sub-step a2), the continuous light-emitting epitaxial film is subjected to the patternwise etching treatment until the metal substrate 21 is exposed to form a plurality of the light-emitting epitaxial layers 221, each of which is sandwiched between the metal substrate 21 and a corresponding one of the first electrodes 222 and two of which are spaced apart from each other by the gap 23, so as to form the micro light-emitting diode dies 22.

In step b), the metal substrate 21 is etched to remove the to-be-etched region 213 so as to divide the light-emitting component 2 into a plurality of the micro light-emitting diode chips 3.

Step b) is implemented by a process including sub-steps of: b1) adhering a release film 201, and b2) subjecting the metal substrate 21 to a wet etching treatment.

In sub-step b1), the release film 201 is adhered to the micro light-emitting diode dies 22 opposite to the metal substrate 21. The release film 201 can be used as a temporary substrate for temporarily adhering the micro light-emitting diode chips 3 to be manufactured. The release film 201 can be a photo-releasable polymeric film, a thermal-releasable polymeric film, or a combination thereof. Examples of the release film 201 include a blue tape, a polyimide film, and the like, but are not limited thereto.

In sub-step b2), the metal substrate 21 is subjected to the wet etching treatment to remove the to-be-etched region 213 of the metal substrate 21. Specifically, in the first embodiment, sub-step b2) is implemented by a process including sub-sub-steps of: b21) applying a patterned photoresist layer 202, b22) etching the to-be-etched region 213 of the metal substrate 21, and b23) removing the patterned photoresist layer 202.

In sub-sub-step b21), the patterned photoresist layer 202 is applied on the second surface 212 of the metal substrate 21. The patterned photoresist layer 202 has a pattern corresponding to a pattern constituted by the micro light-emitting diode dies 22 so as to expose the to-be-etched region 213 of the metal substrate 21 from the patterned photoresist layer 202.

In sub-sub-step b22), the to-be-etched region 213 of the metal substrate 21 is etched by an etchant solution to form the metal substrate 21 into a plurality of second electrodes 223. Each of the second electrodes 223 is disposed on a corresponding one of the light-emitting epitaxial layers 221 opposite to a corresponding one of the first electrodes 222.

In sub-sub-step b23), the patterned photoresist layer 202 is removed so as to make a plurality of the micro light-emitting diode chips 3. Each of the second electrodes 223 and a corresponding one of the first electrodes 222 are used for supplying the electric energy to a corresponding one of the light-emitting epitaxial layers 221 therethrough.

For the subsequent application of the micro light-emitting diode chips 3, the release film 201 can be irradiated or heated partially or fully so as to transfer some or all of the micro light-emitting diode chips 3 from the release film 201 to an application substrate having a control circuit for different applications.

Figure 3:
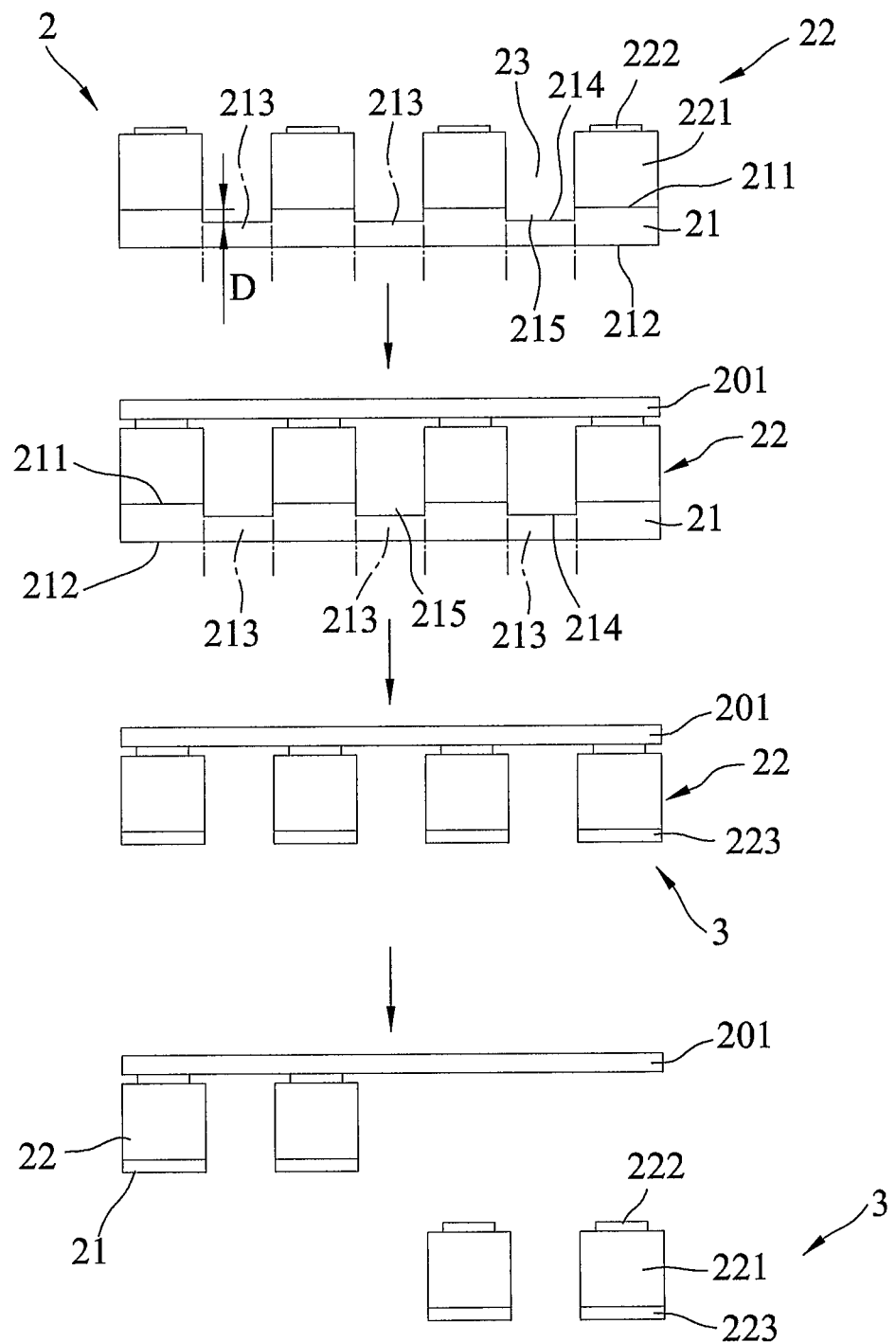
FIG. 3 shows schematic views illustrating consecutive steps of a second embodiment of the method according to the disclosure.

Referring to FIG. 3, a second embodiment of a method for manufacturing micro light-emitting diode chips 3 according to the disclosure is similar to the first embodiment except for the following.

In the second embodiment, the metal substrate 21 provided in step a) has a plurality of recesses 215. Each of the recesses 215 extends from the first surface 211 toward the second surface 212 of the metal substrate 21 to terminate at an end surface 214, and aligns with a corresponding one of the gaps 23.

Step b) in the second embodiment is implemented by a process including sub-steps of: b1') adhering the release film 201, and b2') subjecting the metal substrate 21 to a wet etching treatment. In sub-step b1'), the release film 201 is adhered to the micro light-emitting diode dies 22 opposite to the metal substrate 21. In sub-step b2'), the metal substrate 21 is subjected to the wet etching treatment without a patterned photoresist layer applied on the second surface 212 thereof, until the recesses 215 are exposed to remove the to-be-etched region 213 of the metal substrate 21 and to form the metal substrate 21 into a plurality of the second electrodes 223, each of which is disposed on a corresponding one of the light-emitting epitaxial layers 221 opposite to a corresponding one of the first electrodes 222, so as to obtain a plurality of the micro light-emitting diode chips 3.

The recesses 215 has a depth (D). The metal substrate 21 is thinned by the wet etching treatment to a thickness which is substantially equal to the depth (D). For example, when the metal substrate 21 is a copper/Invar/copper (CIC) composite metal substrate composed of a first copper layer (10 μm in thickness), an Invar layer (30 μm in thickness), and a second copper layer (10 μm in thickness), and the depth (D) of the recesses 215 of the metal substrate 21 is 30 μm, the thickness of the metal substrate 21 is reduced from 50 μm to 30 μm after the wet etching treatment.

The wet etching treatment for the metal substrate 21 can be controlled by adjusting the depth (D) of the recesses 215 of the metal substrate 21, so as to form the metal substrate 21 into the second electrodes 223 having a desirable thickness.

In certain embodiments, the depth (D) of the recesses 215 of the metal substrate 21 is larger than a thickness of the second electrodes 223 formed by the wet etching treatment.

In certain embodiments, the metal substrate 21 is a multi-layered metal composite substrate. The depth (D) of the recesses 215 of the metal substrate 21 is larger than a total thickness of the multi-layered metal composite substrate exclusive of the bottommost layer. Therefore, only the bottommost layer of the multi-layered metal composite substrate needs to be removed by the wet etching treatment to make a plurality of the micro light-emitting diode chips 3.

Figure 4:
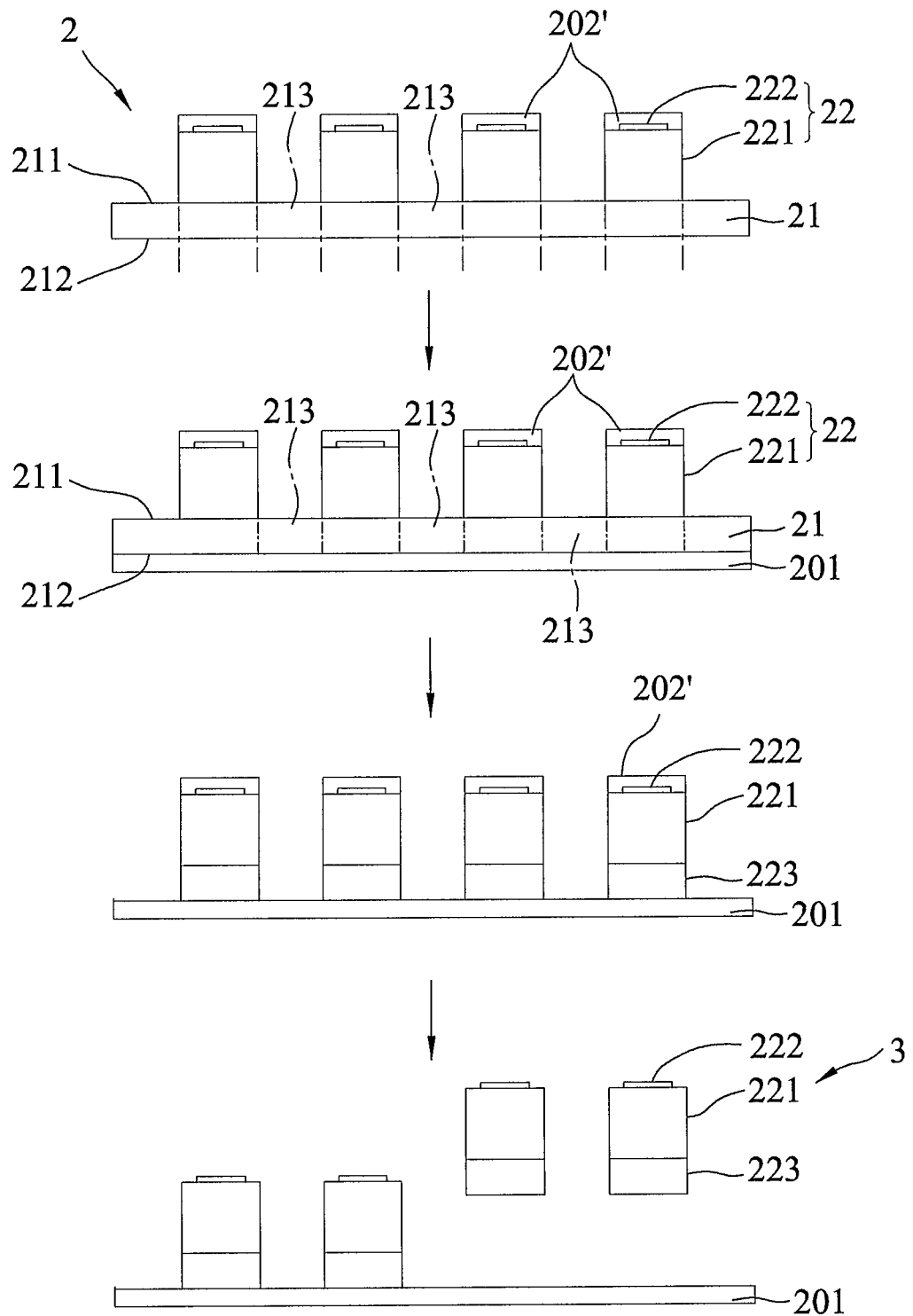
FIG. 4 shows schematic views illustrating consecutive steps of a third embodiment of the method according to the disclosure.

Referring to FIG. 4, a third embodiment of a method for manufacturing micro light-emitting diode chips 3 according to the disclosure is similar to the first embodiment except for the following.

The third embodiment further includes a step, prior to step a), of applying a photoresist layer 202' to each of the micro light-emitting diode dies 22 opposite to the metal substrate 21. In the third embodiment, step b) is implemented by a process including sub-steps of: b1") adhering a release film 201, b2") subjecting the metal substrate 21 to a wet etching treatment, and b3') removing the photoresist layer 202'.

In sub-step b1"), the release film 201 is adhered to the second surface 212 of the metal substrate 21.

In sub-step b2"), the metal substrate 21 is subjected to the wet etching treatment to remove the to-be-etched region 213 of the metal substrate 21 so as to form the metal substrate 21 into a plurality of the second electrodes 223. Each of the second electrodes 223 is disposed on a corresponding one of the light-emitting epitaxial layers 221 opposite to a corresponding one of the first electrodes 222.

In sub-step b3"), the photoresist layer 202' is removed to obtain a plurality of the micro light-emitting diode chips 3.

Similarly, for subsequent application of the micro light-emitting diode chips 3, the release film 201 can be irradiated or heated so as to transfer the micro light-emitting diode chips 3 from the release film 201 to an application substrate having a control circuit for different applications.

In summary, by virtue of the method for manufacturing the micro light-emitting diode chips 3 according to the disclosure, the metal substrate 21 of the to-be-divided light-emitting component 2 is processed by etching to remove the to-be-etched region 213 of the metal substrate 21, so as to divide the light-emitting component 2 into a plurality of the micro light-emitting diode chips 3. Therefore, the aforesaid shortcomings (for example, the inferior cutting yield) of the prior art can be overcome.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A method for manufacturing micro light-emitting diode chips, comprising the steps of:
   a) providing a to-be-divided light-emitting component including
      a metal substrate having a first surface and a second surface opposite to each other, and
      a plurality of micro light-emitting diode dies disposed on the first surface of the metal substrate to permit the metal substrate to define a to-be-etched region among the micro light-emitting diode dies, two adjacent ones of the micro light-emitting diode dies being spaced apart from each other by a gap; and
   b) etching the metal substrate to remove the to-be-etched region so as to divide the light-emitting component into a plurality of the micro light-emitting diode chips,
   wherein step a) includes the sub-steps of:
   a1) preparing a semi-product of the to-be-divided light-emitting component, the semi-product including
      the metal substrate,
      a continuous light-emitting epitaxial film disposed on the first surface of the metal substrate, and
      a plurality of first electrodes disposed on the continuous light-emitting epitaxial film opposite to the metal substrate and spaced apart from one another; and
   a2) subjecting the continuous light-emitting epitaxial film to a patternwise etching treatment until the metal substrate is exposed to form a plurality of light-emitting epitaxial layers, each of which is sandwiched between the metal substrate and a corresponding one of the first electrodes and two of which are spaced apart from each other by the gap, so as to form the micro light-emitting diode dies,
   wherein step b) includes the sub-steps of:
   b1) adhering a release film to the micro light-emitting diode dies opposite to the metal substrate; and
   b2) subjecting the metal substrate to a wet etching treatment to remove the to-be-etched region of the metal substrate.

2. The method according to claim 1, wherein sub-step b2) includes sub-sub-steps of:
   b21) applying on the second surface of the metal substrate, a patterned photoresist layer having a pattern corresponding to a pattern constituted by the micro light-emitting diode dies so as to expose the to-be-etched region of the metal substrate from the patterned photoresist layer;
   b22) etching the to-be-etched region of the metal substrate by an etchant solution to form the metal substrate into a plurality of second electrodes, each of which is disposed on a corresponding one of the light-emitting epitaxial layers opposite to a corresponding one of the first electrodes; and
   b23) removing the patterned photoresist layer to obtain a plurality of the micro light-emitting diode chips.

3. A method for manufacturing micro light-emitting diode chips, comprising the steps of:

a) providing a to-be-divided light-emitting component including
    a metal substrate having a first surface and a second surface opposite to each other, and
    a plurality of micro light-emitting diode dies disposed on the first surface of the metal substrate to permit the metal substrate to define a to-be-etched region among the micro light-emitting diode dies, two adjacent ones of the micro light-emitting diode dies being spaced apart from each other by a gap; and
b) etching the metal substrate to remove the to-be-etched region so as to divide the light-emitting component into a plurality of the micro light-emitting diode chips,
wherein step a) includes the sub-steps of:
a1) preparing a semi-product of the to-be-divided light-emitting component, the semi-product including
    the metal substrate,
    a continuous light-emitting epitaxial film disposed on the first surface of the metal substrate, and
    a plurality of first electrodes disposed on the continuous light-emitting epitaxial film opposite to the metal substrate and spaced apart from one another; and
a2) subjecting the continuous light-emitting epitaxial film to a patternwise etching treatment until the metal substrate is exposed to form a plurality of light-emitting epitaxial layers, each of which is sandwiched between the metal substrate and a corresponding one of the first electrodes and two of which are spaced apart from each other by the gap, so as to form the micro light-emitting diode dies,
wherein in step a), the metal substrate has a plurality of recesses, each of which extends from the first surface toward the second surface of the metal substrate to terminate at an end surface, and each of which aligns with a corresponding one of the gaps, and
step b) includes sub-steps of:
    b1') adhering a release film to the micro light-emitting diode dies opposite to the metal substrate; and
    b2') subjecting the metal substrate to a wet etching treatment until the recesses are exposed to remove the to-be-etched region of the metal substrate and to form the metal substrate into a plurality of second electrodes, each of which is disposed on a corresponding one of the light-emitting epitaxial layers opposite to a corresponding one of the first electrodes, so as to obtain a plurality of the micro light-emitting diode chips.

4. A method for manufacturing micro light-emitting diode chips, comprising the steps of:
a) providing a to-be-divided light-emitting component including
    a metal substrate having a first surface and a second surface opposite to each other, and
    a plurality of micro light-emitting diode dies disposed on the first surface of the metal substrate to permit the metal substrate to define a to-be-etched region among the micro light-emitting diode dies, two adjacent ones of the micro light-emitting diode dies being spaced apart from each other by a gap; and
b) etching the metal substrate to remove the to-be-etched region so as to divide the light-emitting component into a plurality of the micro light-emitting diode chips,
wherein step a) includes the sub-steps of:
a1) preparing a semi-product of the to-be-divided light-emitting component, the semi-product including
    the metal substrate,
    a continuous light-emitting epitaxial film disposed on the first surface of the metal substrate, and
    a plurality of first electrodes disposed on the continuous light-emitting epitaxial film opposite to the metal substrate and spaced apart from one another; and
a2) subjecting the continuous light-emitting epitaxial film to a patternwise etching treatment until the metal substrate is exposed to form a plurality of light-emitting epitaxial layers, each of which is sandwiched between the metal substrate and a corresponding one of the first electrodes and two of which are spaced apart from each other by the gap, so as to form the micro light-emitting diode dies,
wherein step b) includes sub-steps of:
    b1") adhering a release film to the second surface of the metal substrate;
    b2") subjecting the metal substrate to a wet etching treatment to remove the to-be-etched region of the metal substrate so as to form the metal substrate into a plurality of second electrodes, each of which is disposed on a corresponding one of the light-emitting epitaxial layers opposite to a corresponding one of the first electrodes; and
    b3') removing the photoresist layer to make a plurality of the micro light-emitting diode chips,
    further comprising a step, prior to step a), of applying a photoresist layer to each of the micro light-emitting diode dies opposite to the metal substrate.

5. The method according to claim 1, wherein in sub-step b1), the release film is selected from the group consisting of a photo-releasable polymeric film, a thermal-releasable polymeric film, and a combination thereof.

6. The method according to claim 3, wherein in sub-step b1'), the release film is selected from the group consisting of a photo-releasable polymeric film, a thermal-releasable polymeric film, and a combination thereof.

7. The method according to claim 4, wherein in sub-step b1"), the release film is selected from the group consisting of a photo-releasable polymeric film, a thermal-releasable polymeric film, and a combination thereof.

8. The method according to claim 1, wherein in step a), the metal substrate is selected from the group consisting of a single-layered metal substrate and a multi-layered composite metal substrate.

9. The method according to claim 8, wherein the single-layered metal substrate is a copper substrate.

10. The method according to claim 8, wherein the multi-layered composite metal substrate includes a first copper layer, a second copper layer, and a nickel-iron alloy layer sandwiched between the first and second copper layers.

11. The method according to claim 1, wherein in step a), the metal substrate has a thickness of less than 100 μm.

12. The method according to claim 11, wherein the thickness of the metal substrate is less than 50 μm.

13. The method according to claim 3, wherein the recesses have a depth which is larger than a thickness of the second electrodes.

14. The method according to claim 3, wherein in step a), the metal substrate is selected from the group consisting of a single-layered metal substrate and a multi-layered composite metal substrate.

15. The method according to claim 4, wherein in step a), the metal substrate is selected from the group consisting of a single-layered metal substrate and a multi-layered composite metal substrate.

16. The method according to claim 14, wherein the single-layered metal substrate is a copper substrate.

17. The method according to claim 15, wherein the single-layered metal substrate is a copper substrate.

18. The method according to claim 14, wherein the multi-layered composite metal substrate includes a first copper layer, a second copper layer, and a nickel-iron alloy layer sandwiched between the first and second copper layers.

19. The method according to claim 15, wherein the multi-layered composite metal substrate includes a first copper layer, a second copper layer, and a nickel-iron alloy layer sandwiched between the first and second copper layers.

20. The method according to claim 3, wherein in step a), the metal substrate has a thickness of less than 100 µm.

21. The method according to claim 4, wherein in step a), the metal substrate has a thickness of less than 100 µm.

22. The method according to claim 20, wherein the thickness of the metal substrate is less than 50 µm.

23. The method according to claim 21, wherein the thickness of the metal substrate is less than 50 µm.

* * * * *